United States Patent
Brand

(10) Patent No.: US 6,908,795 B2
(45) Date of Patent: *Jun. 21, 2005

(54) METHOD OF FABRICATING AN ENCAPSULANT LOCK FEATURE IN INTEGRATED CIRCUIT PACKAGING

(75) Inventor: Joseph M. Brand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

This patent is subject to a terminal disclaimer.

(21) Appl. No.: 10/056,610

(22) Filed: Jan. 24, 2002

(65) Prior Publication Data

US 2002/0064907 A1 May 30, 2002

Related U.S. Application Data

(62) Division of application No. 09/694,412, filed on Oct. 23, 2000, now Pat. No. 6,423,581, which is a division of application No. 09/335,618, filed on Jun. 18, 1999, now abandoned.

(51) Int. Cl.$^7$ .......................... H01L 21/48; H01L 23/48
(52) U.S. Cl. .................. 438/125; 438/622; 257/758; 257/773
(58) Field of Search ......................... 438/622, 623, 438/106, 118, 124, 125, 126, 127; 257/700, 701, 758, 759, 773, 774, 787

(56) References Cited

U.S. PATENT DOCUMENTS

| | | |
|---|---|---|
| 3,936,575 A | 2/1976 | Watanabe et al. |
| 4,928,162 A | 5/1990 | Lesk et al. |
| 5,255,157 A | 10/1993 | Hegel |
| 5,270,493 A | 12/1993 | Inoue et al. |
| 5,286,926 A | 2/1994 | Kimura et al. |
| 5,336,931 A | 8/1994 | Juskey et al. |
| 5,355,283 A | 10/1994 | Marrs et al. |
| 5,519,201 A | 5/1996 | Templeton, Jr. et al. |
| 5,612,576 A | 3/1997 | Wilson et al. |
| 5,623,006 A | 4/1997 | Papathomas |
| 5,701,034 A | 12/1997 | Marrs |
| 5,722,161 A | 3/1998 | Marrs |
| 5,736,789 A | 4/1998 | Moscicki |
| 5,841,192 A | 11/1998 | Exposito |
| 5,847,446 A | 12/1998 | Park et al. |
| 5,909,054 A | 6/1999 | Kozono |
| 6,097,080 A | 8/2000 | Nakanishi et al. |
| 6,423,581 B1 * | 7/2002 | Brand .................. 438/125 |

* cited by examiner

Primary Examiner—Alonzo Chambliss
Assistant Examiner—M. Baunson
(74) Attorney, Agent, or Firm—Dinsmore & Shohl LLP

(57) ABSTRACT

An encapsulated integrated circuit is provided including a semiconductor die, a printed circuit board, and an encapsulant. The printed circuit board is conductively coupled to the semiconductor die and comprises a laminate defining first and second major faces. The laminate includes a solder resist layer, an electrically conductive layer, and a bismaleimide triazine resin laminate including a selected laminated layer and an adjacent laminated layer. The electrically conductive layer is interposed between the solder resist layer and the underlying substrate. The selected laminated layer is disposed closer to the first major face than the adjacent laminated layer. The laminate includes at least one void formed therein so as to extend from one of the major faces through the solder resist layer and the electrically conductive layer at least as far as the adjacent laminated layer. The void is characterized by a varying profile that defines a ledge portion in the selected laminated layer and an underlying cavity in the adjacent laminated layer. The encapsulant is positioned to mechanically couple the semiconductor die to the printed circuit board and to extend through the void into the underlying cavity so as to form an adhesive bond with the bismaleimide triazine resin laminate. The semiconductor die is supported by the bismaleimide triazine resin laminate and the encapsulant and the bismaleimide triazine resin laminate are arranged to enclose substantially all of the semiconductor die.

14 Claims, 2 Drawing Sheets

METHOD OF FABRICATING AN ENCAPSULANT LOCK FEATURE IN INTEGRATED CIRCUIT PACKAGING

CROSS REFERENCE TO RELATED APPLICATIONS

This application is a division of U.S. patent application Ser. No. 09/694,412, filed Oct. 23, 2000, now U.S. Pat. No. 6,423,581 which is a division application of U.S. patent application Ser. No. 09/335,618, filed Jun. 18, 1999, now abandoned.

BACKGROUND OF THE INVENTION

The present invention relates to semiconductor die encapsulation and, more particularly, to an encapsulation scheme that provides for improved adhesion of the encapsulant to an underlying printed circuit board.

Plastic encapsulates are commonly used in integrated circuit packaging to protect the integrity of the encapsulated semiconductor die and the associated electrical connections. U.S. Pat. No. 5,701,034 (Marrs) is directed to providing improved encapsulation of a semiconductor die and teaches the formation of a locking moat in a heat sink to which the semiconductor die is coupled. The encapsulant material is cured in the locking moat of the heat sink and about the semiconductor die to interlock the encapsulant and the heat sink. The teachings of U.S. Pat. No. 5,701,034 are not, however, related to improving adhesion or coupling of the encapsulant to resin laminates commonly utilized to form printed circuit boards. Further, the design of the locking moats and the structure of the heat sink in the '034 patent do not complement each other to provide for an efficient method of manufacture.

In many instances, a semiconductor die is positioned on the upper surface of a printed circuit board substrate and an encapsulant is arranged to cover the semiconductor die, portions of the upper surface of the substrate, and any leads, bond pads, or other bonding locations on the upper surface of the substrate. Robust encapsulant-to-substrate adhesion is critical in this type of structure because the encapsulant contacts only the upper surface of the substrate, as opposed to completely surrounding the substrate and die.

In practice, encapsulant-to-substrate adhesion is limited by specific design constraints. For example, the upper surface of the substrate typically includes conductive portions and solder resist portions. It is often difficult to identify a suitable encapsulant that bonds equally well to the conductive portions and the solder resist portions. Further, the encapsulant material must also be selected to minimize the deleterious effects of particulate matter contaminating the surface of the substrate. All of these design considerations limit the ability to achieve sufficient encapsulant-to-substrate adhesion.

Accordingly, there is a need for a semiconductor die encapsulation scheme that provides for optimum encapsulant-to-substrate adhesion while accounting for variations in the composition of the substrate surface and for the deleterious effects of particulate matter on the surface of the substrate, particularly where the substrate involved is a printed circuit board laminate. Further, there is a need in the art for an encapsulation scheme that is directed to improving adhesion or coupling of the encapsulant to the resin laminates commonly utilized to form printed circuit boards.

BRIEF SUMMARY OF THE INVENTION

This need is met by the present invention wherein a void is formed in the structure of a laminate supporting a semiconductor die and where an encapsulant is arranged to encapsulate the semiconductor die and fill the void in the laminate.

In accordance with one embodiment of the present invention, a packaged semiconductor device is provided comprising a semiconductor chip, a laminate, and an encapsulant. The laminate defines first and second major faces and includes an electrically conductive layer, an underlying substrate supporting the electrically conductive layer, and at least one void formed in the laminate so as to extend from one of the major faces through the electrically conductive layer at least as far as the underlying substrate. The encapsulant is positioned to mechanically couple the semiconductor die to the laminate to extend into the void so as to contact the underlying substrate.

The void or voids preferably extend into the underlying substrate and may extend from the first major face through the electrically conductive layer and the underlying substrate to the second major face. The contact between the encapsulant and the underlying substrate is preferably characterized by an adhesive bond and the encapsulant preferably occupies substantially all of the void.

In accordance with another embodiment of the present invention, a packaged semiconductor device is provided comprising a semiconductor chip, a laminate, and an encapsulant. The laminate defines first and second major faces and includes a solder resist layer, an underlying substrate, an electrically conductive layer interposed between the solder resist layer and the underlying substrate, and at least one void formed in the laminate so as to extend from one of the major faces through the solder resist layer and the electrically conductive layer at least as far as the underlying substrate. The encapsulant is positioned to mechanically couple the semiconductor die to the laminate and to extend into the void so as to contact the underlying substrate.

In accordance with yet another embodiment of the present invention, a packaged semiconductor device is provided comprising a semiconductor chip, a laminate, and an encapsulant. The laminate defines first and second major faces and includes a plurality of laminated layers. The laminate also includes at least one void formed therein so as to extend from one of the major faces through a plurality of the laminated layers. The encapsulant is positioned to mechanically couple the semiconductor die to the laminate and is further positioned to extend into the void across the plurality of laminated layers so as to contact a portion of the laminate between the first and second major faces of the laminate.

In accordance with yet another embodiment of the present invention, a packaged semiconductor device is provided comprising a semiconductor chip, a prepreg epoxy resin glass-cloth laminate, and an encapsulant. The prepreg epoxy resin glass-cloth laminate defines first and second major faces and includes a plurality of laminated prepreg layers and at least one void formed therein so as to extend from one of the major faces through a plurality of the laminated prepreg layers. The encapsulant is positioned to mechanically couple the semiconductor die to the prepreg epoxy resin glass-cloth laminate and to extend into the void across the plurality of laminated prepreg layers so as to contact a portion of the laminate between the first and second major faces of the laminate.

In accordance with yet another embodiment of the present invention, a packaged semiconductor device is provided comprising a semiconductor chip, a laminate, and an encapsulant. The laminate defines first and second major faces and includes a plurality of laminated layers and at least one void formed therein so as to extend from one of the major faces through a plurality of the laminated layers. The void is characterized by a profile that varies across adjacent laminated layers. The encapsulant is positioned to mechanically couple the semiconductor die to the laminate and to extend into the void across the varying profile so as to contact a portion of the laminate between the first and second major faces of the laminate. The varying profile may be characterized by a cross-sectional area that changes from a first value in a selected laminated layer to a second value in an adjacent laminated layer. The second value is preferably larger than the first value.

In accordance with yet another embodiment of the present invention, a packaged semiconductor device is provided comprising a semiconductor chip, a laminate, and an encapsulant. The laminate defines first and second major faces and includes a plurality of laminated layers, including a selected laminated layer and an adjacent laminated layer. The selected laminated layer is disposed closer to the first major face than the adjacent laminated layer. The laminate includes at least one void formed therein so as to extend from the first major face through the selected laminated layer and into the adjacent laminated layer. The void is characterized by a varying profile that defines a ledge portion in the selected laminated layer and an underlying cavity in the adjacent laminated layer. An encapsulant is positioned to mechanically couple the semiconductor die to the laminate and to extend into the void across the ledge portion into the underlying cavity so as to contact a portion of the laminate between the first and second major faces of the laminate. The selected laminated layer may comprise a plurality of laminated layers. Similarly, the adjacent laminated layer may comprise a plurality of laminated layers.

In accordance with yet another embodiment of the present invention, a packaged semiconductor device is provided comprising a semiconductor chip, a laminate, and an encapsulant. The laminate defines first and second major faces and includes a plurality of laminated layers and at least one void formed therein so as to extend from one of the major faces through a plurality of the laminated layers. The void is characterized by a cross-sectional area that changes from a first value in a selected laminated layer to a second value in an adjacent laminated layer. The encapsulant is positioned to mechanically couple the semiconductor die to the laminate, wherein the encapsulant is further positioned to extend into the void across the varying cross-sectional area.

In accordance with yet another embodiment of the present invention, an encapsulated integrated circuit is provided comprising a semiconductor die, a printed circuit board, and an encapsulant. The printed circuit board is conductively coupled to the semiconductor die and comprises a laminate defining first and second major faces. The laminate includes a solder resist layer, an underlying substrate, an electrically conductive layer interposed between the solder resist layer and the underlying substrate, and at least one void formed in the printed circuit board so as to extend from one of the major faces through the solder resist layer and the electrically conductive layer at least as far as the underlying substrate. The encapsulant is positioned to mechanically couple the semiconductor die to the printed circuit board and to extend into the void.

In accordance with yet another embodiment of the present invention, a computer is provided including at least one packaged semiconductor device comprising a semiconductor chip, a laminate, and an encapsulant. The laminate defines first and second major faces and includes an electrically conductive layer, an underlying substrate supporting the electrically conductive layer, and at least one void formed in the laminate so as to extend from one of the major faces through the electrically conductive layer at least as far as the underlying substrate. The encapsulant is positioned to mechanically couple the semiconductor die to the laminate and to extend into the void so as to contact the underlying substrate.

In accordance with yet another embodiment of the present invention, an epoxy resin glass-cloth laminate is provided comprising first and second major faces, and a plurality of laminated epoxy resin glass-cloth layers. The second major face is oriented substantially parallel to the first major face. The plurality of laminated epoxy resin glass-cloth layers define a portion of the laminate between the first and second major faces. The laminate includes at least one void formed therein so as to extend from one of the major faces through a plurality of the laminated layers. The void is characterized by a profile that varies across adjacent laminated layers. The laminated layers preferably comprise bismaleimide triazine resin.

In accordance with yet another embodiment of the present invention, an encapsulated integrated circuit is provided comprising a semiconductor die, a printed circuit board, and an encapsulant. The printed circuit board is conductively coupled to the semiconductor die and comprises a laminate defining first and second major faces. The laminate includes a solder resist layer, an electrically conductive layer, and a bismaleimide triazine resin laminate including a selected laminated layer and an adjacent laminated layer. The electrically conductive layer is interposed between the solder resist layer and the underlying substrate. The selected laminated layer is disposed closer to the first major face than the adjacent laminated layer. The laminate includes at least one void formed therein so as to extend from one of the major faces through the solder resist layer and the electrically conductive layer at least as far as the adjacent laminated layer. The void is characterized by a varying profile that defines a ledge portion in the selected laminated layer and an underlying cavity in the adjacent laminated layer. The encapsulant is positioned to mechanically couple the semiconductor die to the printed circuit board and to extend through the void into the underlying cavity so as to form an adhesive bond with the bismaleimide triazine resin laminate. The semiconductor die is supported by the bismaleimide triazine resin laminate and the encapsulant and the bismaleimide triazine resin laminate are arranged to enclose substantially all of the semiconductor die.

In accordance with yet another embodiment of the present invention, a method of encapsulating an integrated circuit is provided comprising the steps of (i) providing a semiconductor chip; (ii) providing a laminate defining first and second major faces, the laminate including an electrically conductive layer, and an underlying substrate supporting the electrically conductive layer; (iii) forming at least one void in the laminate so as to extend from one of the major faces through the electrically conductive layer at least as far as the underlying substrate; and (iv) encapsulating the semiconductor die and the laminate with an encapsulant such that the encapsulant extends into the void to contact the underlying substrate.

In accordance with yet another embodiment of the present invention, a method of forming an epoxy resin glass-cloth laminate is provided and comprises a process of laminating a plurality of epoxy resin glass-cloth layers such that the laminate includes at least one void formed therein extending from one of the major faces through a plurality of the laminated layers, and such that the void is characterized by a profile that varies across adjacent laminated layers.

Accordingly, it is an object of the present invention to provide a packaged semiconductor device or encapsulated integrated circuit, a computer including a packaged semiconductor device, a method of encapsulating an integrated circuit, and a method of forming an epoxy resin glass-cloth laminate whereby an encapsulant may be arranged to encapsulate a semiconductor die and fill a void formed in the structure of a laminate supporting the semiconductor die. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION OF THE PREFERRED EMBODIMENTS

Figure 1:
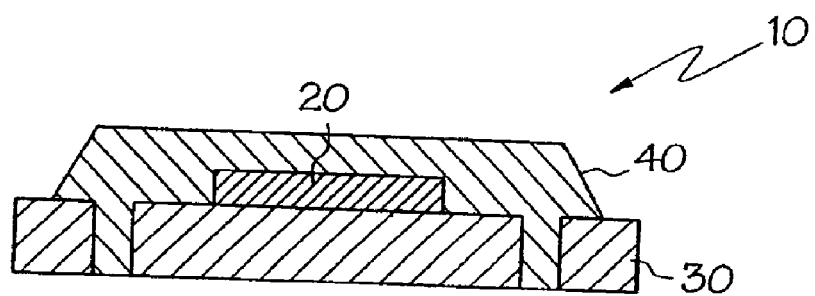
FIG. 1 is a schematic cross-sectional illustration of an encapsulated semiconductor die package according to the present invention.
Figure 2:
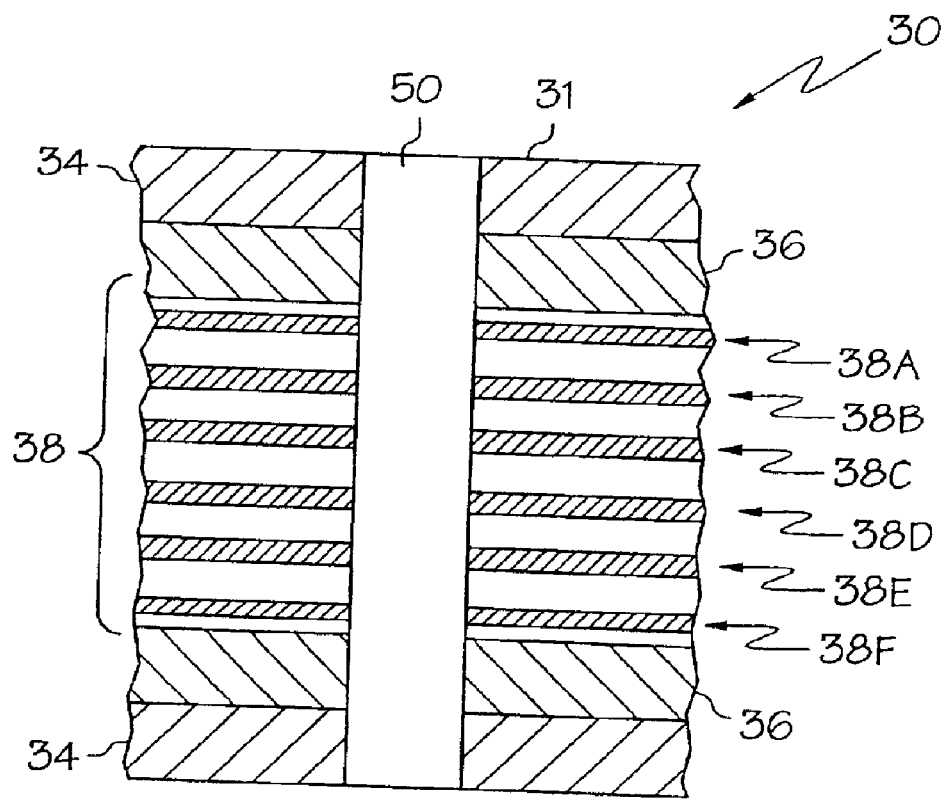
FIG. 2 is a schematic, broken away, cross-sectional illustration of a portion of a encapsulated semiconductor die package according to one embodiment of the present invention.

Referring now to FIGS. 1 and 2, a packaged semiconductor device or encapsulated integrated circuit 10 according to the present invention comprises a semiconductor die or chip 20, a printed circuit board laminate 30 conductively coupled to the semiconductor die 20 (electrical connections not shown), and an encapsulant 40.

The printed circuit board laminate 30 comprises a laminate defining a first major face 31 and a second major face 32. At its first major face 31, the laminate includes a solder resist layer 34, an electrically conductive layer 36, and an underlying resin laminate substrate 38 supporting the electrically conductive layer 36 and the solder resist layer 34. In the illustrated embodiment, the printed circuit board laminate 30 includes an additional solder resist layer 34 and an additional electrically conductive layer 36 at the second major face 32 of the printed circuit board laminate 30.

The resin laminate 38 of the printed circuit board laminate 30 is preferably a prepreg epoxy resin glass-cloth laminate, e.g., a BT laminate (bismaleimide triazine), an FR-4 epoxy-glass laminate, an FR-5 epoxy-glass laminate, or another suitable laminate structure. The resin laminate 38 includes a plurality of adjacent laminated layers 38A–38F. The nature and extent of each laminated layer is perhaps best illustrated in the exploded view illustration of FIG. 4.

A void 50 is formed in the printed circuit board laminate 30 and extends from the first major face 31, through the plurality of adjacent laminated layers 38A–38F, to the second major face 32. The encapsulant 40 is positioned to mechanically couple the semiconductor die 20 to the printed circuit board laminate 30 by extending into the void 50 across the plurality of laminated layers 38A–38F. The resulting contact between the encapsulant 40 and the interior portion of the printed circuit board laminate 30 is characterized by an adhesive bond that solidifies the structure of the encapsulated integrated circuit 10. Preferably, the encapsulant 40 occupies substantially all of the void 50. Further, the encapsulant 40 and the printed circuit board laminate 30 enclose substantially all of the semiconductor die 10.

Figure 3:
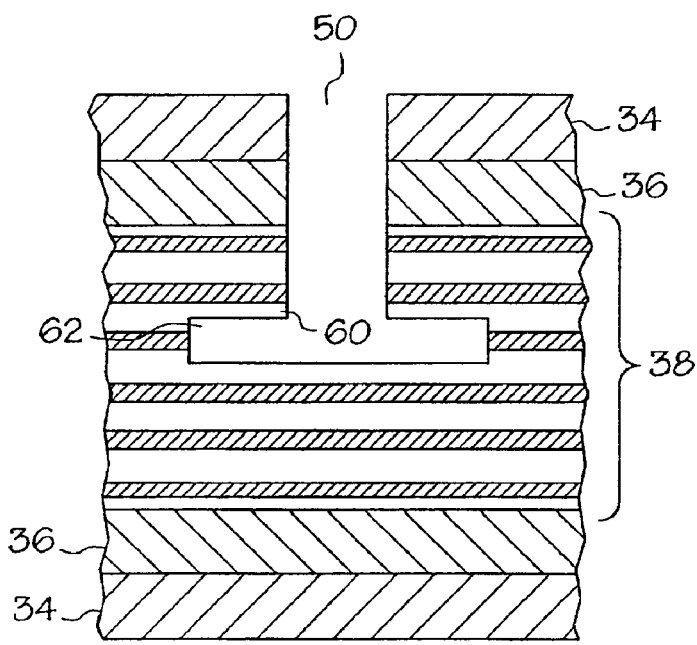
FIG. 3 is a schematic, broken away, cross-sectional illustration of a portion of a encapsulated semiconductor die package according to an alternative embodiment of the present invention.
Figure 4:
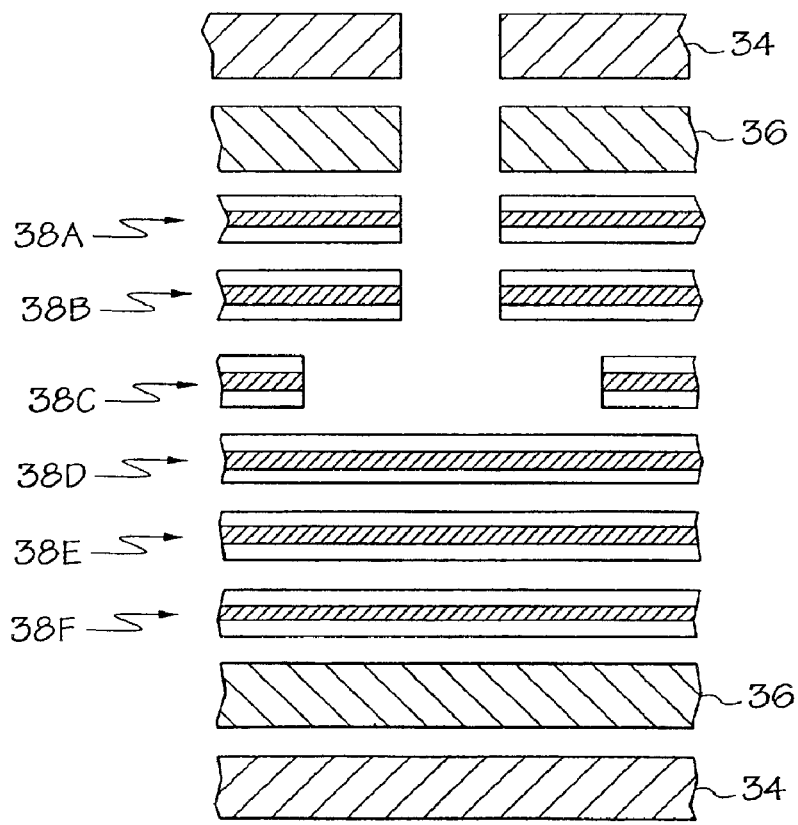
FIG. 4 is an exploded view of the encapsulated semiconductor die package illustrated in FIG. 3.

Referring now to FIGS. 3 and 4, an alternative embodiment of the present invention is illustrated. In the embodiment of FIGS. 3 and 4, the void 50 is characterized by a profile that varies across the plurality of adjacent laminated layers 38A–38F. The encapsulant 40 (not shown in FIGS. 3 and 4) is arranged to extend into the void 50 across the varying profile. In this manner, the varying profile functions to further secure the encapsulant within the void 50 and further solidify the mechanical coupling between the semiconductor die 20 and the printed circuit board laminate 30.

In the illustrated embodiment, the varying profile of the void 50 defines a ledge portion 60 in the selected laminated layers 38A, 38B and an underlying cavity 62 in the adjacent laminated layer 38C such that the varying profile of the void 50 is characterized by a cross-sectional area that changes from a first value in the selected laminated layers 38A, 38B to a larger value in the adjacent laminated layer 38C. Although, in the illustrated embodiment, two laminated layers 38A, 38B define the ledge portion 60 and a single laminated layer 38C defines the underlying cavity 62, it is contemplated by the present invention that any number of layers may be selected to form the ledge portion 60 and the underlying cavity 62. Further, although a simple T-shaped profile is illustrated in FIGS. 3 and 4, it is contemplated by the present invention that a variety of varying profiles may be utilized to accomplish the objectives of the present invention.

As will be appreciated by those practicing the present invention the method of encapsulating the integrated circuit or semiconductor die 20 comprises the steps of: (i) providing the semiconductor die 20; (ii) providing the printed circuit board laminate 30; (iii) forming the void 50 in the laminate 30 such that it extends at least as far as the underlying resin laminate substrate 38; and (iv) encapsulating the semiconductor die 20 and the laminate 30 with an encapsulant 40 such that the encapsulant 40 extends into the void to contact the underlying substrate 38. As will be further appreciated by those practicing the present invention, a variety of methods are available for forming the void 50. For example, the void 50 may be formed by drilling, stamping, or chemical etching. Further, it is contemplated by the present invention that the varying profile of the void 50 within the resin laminate substrate 38 may be provided by processing separately individual ones of the plurality of adjacent laminated layers 38A–38F with respective portions of the void 50 formed in selected ones of the layers 38A–38F. Subsequently, the respective void portions of each layer are aligned to formed the desired profile and joined into a unified resin laminate substrate 38.

Having described the invention in detail and by reference to preferred embodiments thereof, it will be apparent that modifications and variations are possible without departing from the scope of the invention defined in the appended claims.

What is claimed is:

1. A method of encapsulating an integrated circuit comprising:

providing a semiconductor chip;

providing a laminate defining first and second major faces said laminate including an upper electrically conductive layer at said first major face, an underlying resin laminate substrate supporting said upper electrically conductive layer, and a lower electrically conductive layer at said second major face;

forming at least one void in said laminate so as to extend from one of said major faces through said upper electrically conductive layer into said underlying resin laminate substrate, but not as far as said lower electrically conductive layer and said second major face; and encapsulating said semiconductor chip and said laminate with an encapsulant such that said encapsulant extends into said void to contact said underlying substrate.

2. A method of forming a laminate to lock an encapsulant comprising:

providing a lower continuous conductive layer;

providing at least one continuous resin laminate layer over said lower continuous conductive layer;

providing a second resin laminate layer over said continuous resin laminate layer, so as to define an underlying cavity in said second resin laminate layer;

providing a third resin laminate layer over said second resin laminate layer, so as to define a void portion in said third resin laminate layer over said underlying cavity;

providing a fourth resin laminate layer over said third resin laminate layer, so as to define a void portion in said fourth resin laminate layer over said void portion of said third resin laminate layer;

providing an upper conductive layer over said fourth resin laminate layer, so as to define a void portion in said upper conductive layer over said void portion of said fourth resin laminate layer; and providing a solder resist layer over said upper conductive layer, so as to define a void portion in said solder resist layer over said void portion of said upper conductive layer, wherein each said void portion taken together defines a void which does not extend as far as said lower continuous conductive layer.

3. The method of claim 2, wherein said underlying cavity, said void portion of said third resin laminate layer, said void portion of said fourth resin laminate layer, said void portion of said upper conductive layer and said void portion of said solder resist layer are formed to collectively form a void.

4. The method of claim 3 further comprising:

placing a die over at least a portion of said solder resist layer; and forming an encapsulant over said solder resist layer, over said die and in said void.

5. The method of claim 3, wherein said void has a varying profile.

6. The method of claim 5, wherein said void having a varying profile is formed by a process selected from the group consisting of drilling, stamping, chemical etching, and combinations thereof.

7. The method of claim 5, wherein said void having a varying profile is formed having a T-shaped profile.

8. The method of claim 3, wherein said void extends into said resin laminate, but not entirely through said continuous resin laminate layer.

9. A method of encapsulating an integrated circuit comprising:

providing a die;

providing a substrate having at least one continuous lower conductive laminate layer and at least one resin layer over said continuous lower conductive laminate layer;

providing at least one upper conductive laminate layer over said at least one resin layer;

forming a void in said at least one resin layer and said at least one upper conductive laminate layer such that a portion of said void located in said at least one resin layer is below a remaining portion of said at least one upper conductive laminate layer, wherein said void does not extend as far as said continuous lower conductive laminate layer;

placing said die over said at least one upper conductive laminate layer; and encapsulating said die by forming encapsulant over said at least one upper conductive laminate layer, over said die and in said void.

10. The method of claim 9, wherein said at least one upper conductive laminate layer is formed by forming a conductive layer over said at least one resin layer and forming a solder resist layer over said conductive layer.

11. The method of claim 9, wherein said void is formed by forming an underlying cavity in said at least one upper conductive laminate layer.

12. The method of claim 9, wherein said encapsulant is formed in substantially all of said void.

13. The method of claim 9, wherein said at least one resin layer is formed from bismaleimide triazine laminate.

14. The method of claim 9, wherein said at least one resin layer is formed from FR-4 epoxy-glass laminate.

* * * * *